United States Patent [19]

Tantraporn et al.

[11] 4,109,169
[45] Aug. 22, 1978

[54] AVALANCHE MEMORY TRIODE AND LOGIC CIRCUITS

[75] Inventors: Wirojana Tantraporn; Se Puan Yu, both of Schenectady, N.Y.

[73] Assignee: General Electric Company, Schenectady, N.Y.

[21] Appl. No.: 747,543

[22] Filed: Dec. 6, 1976

[51] Int. Cl.$^2$ ............ H03K 17/00; H01L 29/88
[52] U.S. Cl. .................... 307/302; 307/215; 307/218; 307/221 R; 357/13; 307/238
[58] Field of Search ............ 307/302, 283, 218, 215, 307/221, 238; 357/13

[56] References Cited
U.S. PATENT DOCUMENTS

| 2,912,596 | 10/1959 | Huang ..................... 307/221 R |
| 2,995,664 | 8/1961 | Deuttch .................... 307/218 |
| 3,204,160 | 8/1965 | Sah ......................... 307/302 |
| 3,319,138 | 5/1967 | Bergman et al. ............. 307/302 |
| 3,821,657 | 6/1974 | Yu et al. ................... 357/13 |

OTHER PUBLICATIONS

Avalanche Transistor Circuits, by Silver Electronics World, 9/67, pp. 30-32.
IBM Tech. Disclosure Buletin Dual Emitter Avalanche Transistor Memory Array by E. E. Davidson, vol. 11, No. 11, 4/69.

*Primary Examiner*—Stanley D. Miller, Jr.
*Assistant Examiner*—B. P. Davis
*Attorney, Agent, or Firm*—Donald R. Campbell; Joseph T. Cohen; Marvin Snyder

[57] ABSTRACT

A semiconductor controlled avalanche triode operableat microwave frequencies is turned on by a narrow pulse, and remains conducting due to the positive feedback effect of returning carriers in the base region until turned off by an opposite polarity narrow pulse. Applications include a fast switch, a memory device, and various logic circuits such as logic gates and shift registers. The memory and logic devices are fast, require low power, available in npn or pnp configurations, are simple with one triode per memory, and can be made of silicon so as to be integrable.

20 Claims, 16 Drawing Figures

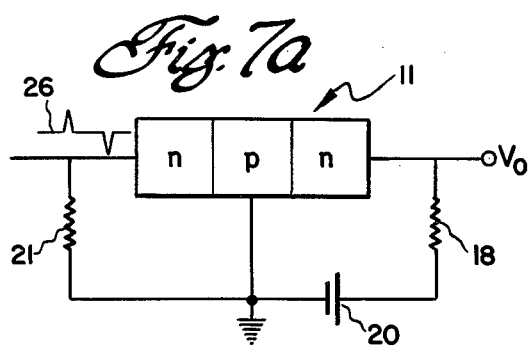
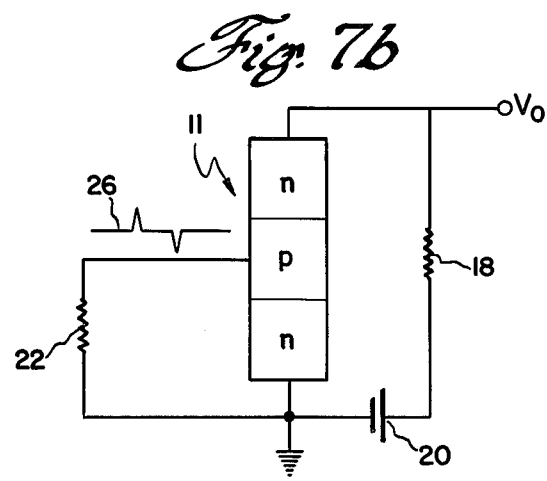
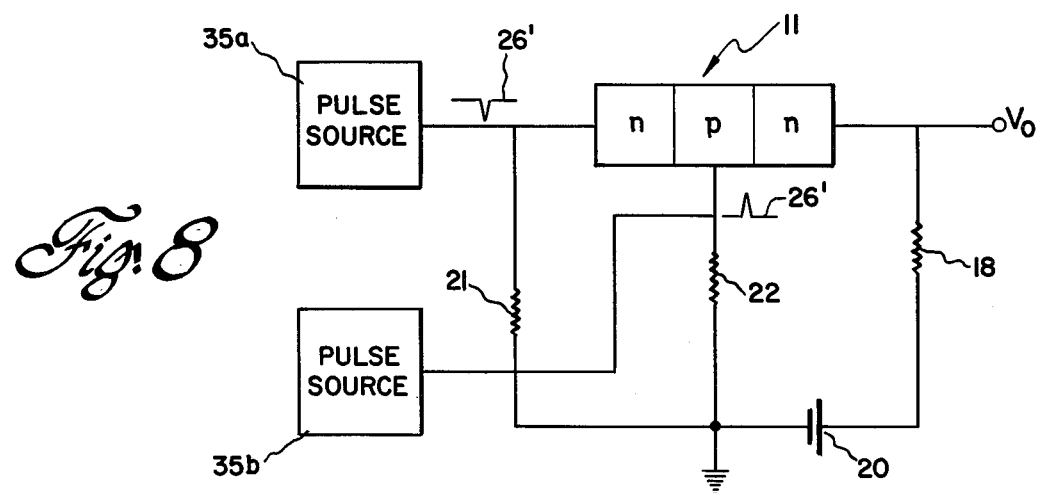
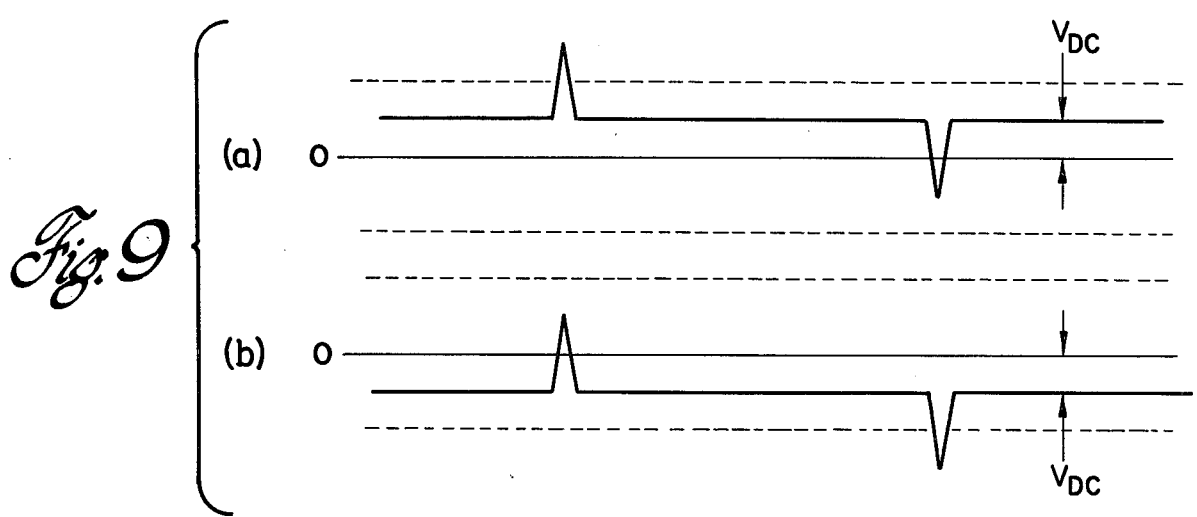

AVALANCHE MEMORY TRIODE AND LOGIC CIRCUITS

BACKGROUND OF THE INVENTION

This invention relates to memory and logic circuits using a high speed semiconductor device, and more particularly to applications of a controlled avalanche triode in a memory device, a switch device, and in various logic devices and circuits.

It is desirable in the semiconductor industry to have memory and logic devices with the following attributes: made of silicon so that the device can be incorporated into present LSI (large scale integration) technology, simple to fabricate, simple to operate, small size as to per unit memory or unit logic step so as to be practical in LSI circuitry, fast with a switching time of less than 1 nanosecond, small power consumption with a power-delay time product of less than $10^{-12}$ joules, simple cascading topology for easy access and transfer of logic data, and nonvolatile. With the exception that the high speed avalanche memory triode herein described is a volatile device, all of these criteria and characteristics are satisfied.

Although there are many different types of volatile memory and logic devices, several can be mentioned by way of comparing their relative merits. The Josephson junction flip-flop "and" logic gate disclosed in the literature in 1975 is fast with low power dissipation and a small power-delay time product by the above criteria, but these are superconductive elements and do not have general applications since the circuit must be cryogenized. Schottky gate Gunn logic devices are as fast with a comparable power-delay time product; however, the device employs unique properties of gallium arsenide and, hence, is not amenable to silicon LSI technology. Further, such a device has large power density consumption requirements and is not suitable for continuous wave applications. State-of-the-art silicon logic devices, such as diodes, transistors, and I$^2$L (Integrated Injection Logic) devices, basically use a minimum cell of at least two active devices connected as a flip-flop, although I$^2$L devices take advantage of better interconnection topology. The delay time is long, typically 10 nanoseconds per gate, while the power consumption is low with a comparable power-delay time product by the above criteria. The present invention in particular is an improvement over such silicon logic devices.

SUMMARY OF THE INVENTION

In accordance with the invention, the active semiconductor device in a variety of memory, switch and logic devices is a controlled avalanche memory triode comprising contiguous emitter, base and collector regions in either the npn or pnp configuration, with the collector region having an avalanche zone of limited lateral extent. Bias means applies a reverse bias voltage between the collector and base terminals sufficient to cause low ratio avalanche multiplication of charge carriers injected into the collector region. The triode is similar to that described in U.S. Pat. No. 3,821,657 to the present inventors; however, that device is constructed for microwave power amplification. It is here recognized that the positive feedback effect of carriers (holes in a npn device) generated by the avalanche process and returning to the base region can be utilized to maintain the conducting state of the device after the injection signal is turned off. For the memory or switch application, the collector region of the avalanche triode also has a hyperabrupt doping profile to achieve avalanche multiplication at a controlled location generally centrally of the base-collector junction, but the device geometrical designs differ from those for power amplification. Pulse source means supplies input signals, with an interval therebetween, effectively between the emitter and base terminals, one input signal serving to switch the voltage (or current) at any of the triode terminals from a first magnitude to a second magnitude which persists until application of the succeeding input signal switches the circuit parameter back to the first magnitude.

The input signals may be very narrow, must have an above-threshold amplitude to effect switching, and can be applied to either the emitter or base terminals. In addition, the "on" and "off" states can be identified at any of the terminals, although most commonly at the collector or base terminal, so that great flexibility is offered to meet the varying requirements of different applications. For example, in a random access memory, switching to the conducting state requires coincident subthreshold signal pulses applied to both the emitter and base terminals. Also, a voltage bias can be applied to the terminal to which the subthreshold input signal is supplied, to effect switching depending on whether the bias is present or not, or to favor the "on" state or "off" state according to the application. A logic gate is implemented with an avalanche triode having multiple emitter or base regions, as for instance an OR gate in which an input signal applied to any one emitter terminal switches the device. Exemplary logic devices that are described include AND, OR, NAND, and NOR gates, a shift register with one triode per stage, and a conventional shift register implemented with complementary devices. These memory, switch, and logic circuits can be made of silicon so as to be integrable, are fast ($10^{-11}$ seconds switching time), have a small power consumption, are small, simple to fabricate, simple to operate, and can be cascaded easily.

BRIEF DESCRIPTION OF THE DRAWINGS

FIGS. 7a and 7b are schematic circuit diagrams similar to FIG. 1 of a fast switch device;

FIG. 8 is a schematic circuit diagram of a random access memory cell or AND logic gate requiring coincident subthreshold signal pulses at the emitter and gate terminals;

FIGS. 9a and 9b are waveform diagrams applicable to other operating modes for the memory device;

DESCRIPTION OF THE PREFERRED EMBODIMENTS

The npn or pnp controlled avalanche memory triode herein described has the capability of remaining conducting from emitter to collector after removal of the injection signal until the applied voltage to the emitter-base junction is reversed to interrupt the positive feedback processes. As compared to a bipolar transistor, only a narrow input signal is required to turn on the device which then remains in the conducting state until turned off by the application of another appropriate input signal. The memory characteristic of this three-terminal semiconductor avalanche device, which is operable at microwave frequencies with a switching time as low as $10^{-11}$ seconds, is employed to realize fast switch devices, memory devices, and a variety of logic devices and circuits.

Figure 1:
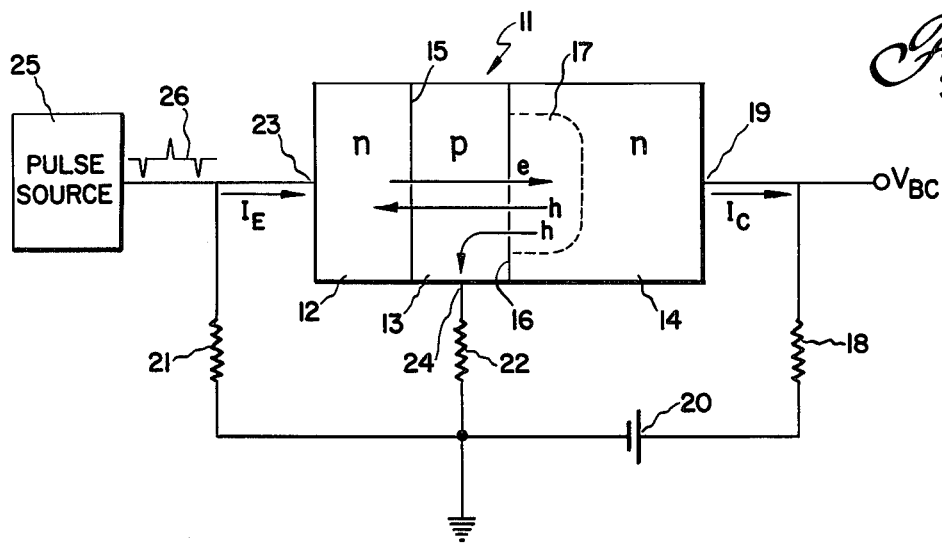
FIG. 1 is a schematic circuit diagram of a fast semiconductor memory device using a controlled avalanche triode.

In FIG. 1, the avalanche triode memory circuit is comprised of only a single controlled avalanche triode device 11 having an emitter region 12, a base region 13, and a collector region 14 which are contiguous and respectively form an emitter-base junction 15 and a base-collector junction 16. The device is very similar to a bipolar transistor in its structure and its use in a circuit, the essential structural difference in the controlled avalanche triode being that in the collector region there is an avalanche zone or layer 17 of limited lateral extent adjacent to the base. In the controlled avalanche triode, the charge giving rise to the collector current $I_C$ is primarily generated in the base-collector depletion region by avalanche multiplication of a relatively small injected signal, and the multiplication factor is low on the order of about four to ten times. By contrast, in a transistor the total charge is injected. To complete the memory circuit in the common base configuration, a collector resistor 18 is coupled to the collector terminal 19 in series with a source of bias voltage 20 connected to reverse-bias the base-collector junction to provide low ratio avalanche multiplication. An emitter resistor 21 and a base resistor 22 are respectively coupled between the emitter terminal 23 and the base terminal 24 and ground, the negative terminal of bias voltage source 20 also being at ground. For definiteness and npn controlled avalanche triode is discussed, and it is assumed that a pulse source 25 applies opposite polarity input signals 26 with an interval therebetween to emitter terminal 23, while the collector current $I_C$ or voltage $V_{BC}$ at the collector terminal is sensed to provide an indication of the conducting or nonconducting state of the device.

Figure 2:
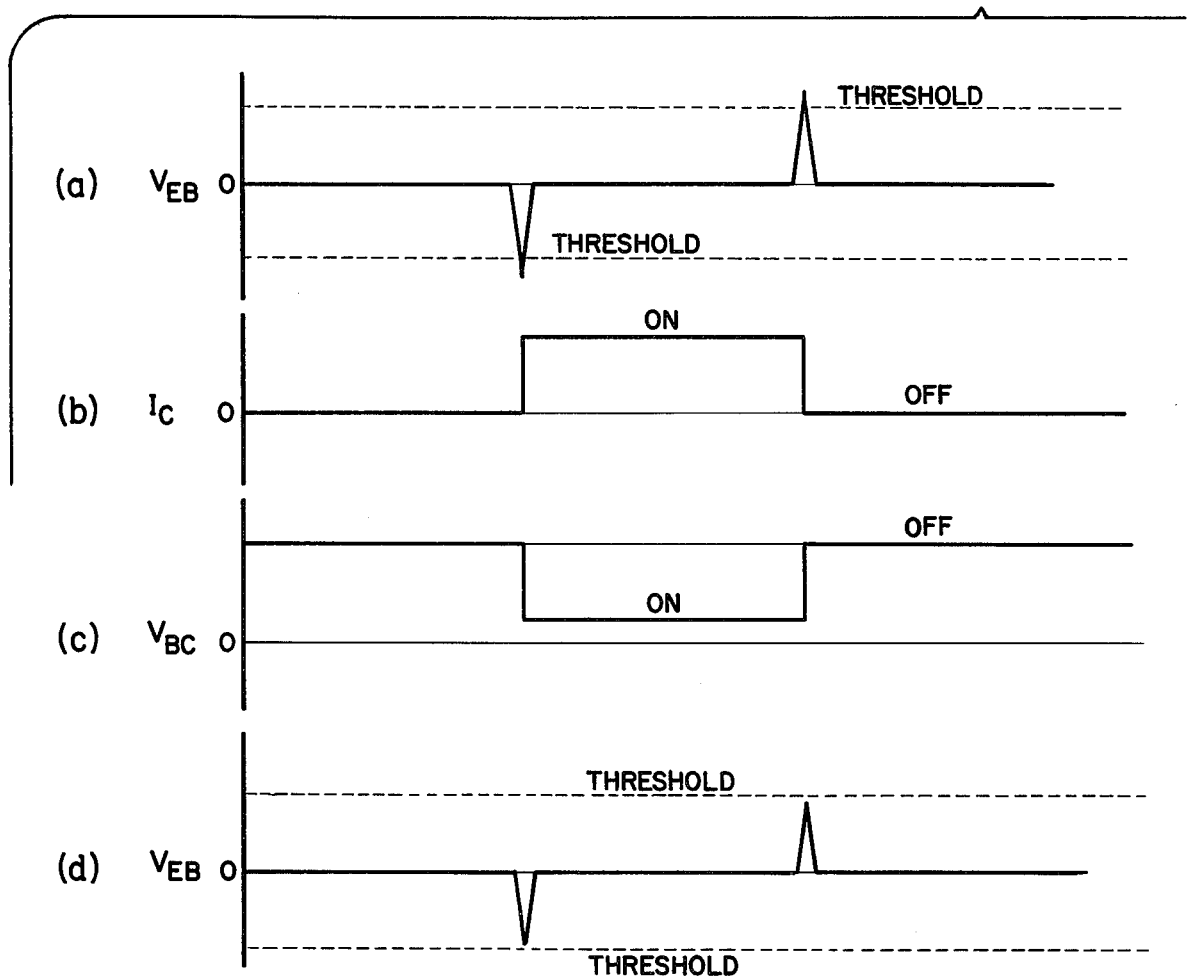
FIGS. 2a–2d are waveform diagrams of the signal pulses and collector current and voltage useful in explaining operation of FIG. 1.

Operation of the avalanche triode memory is evident from the voltage and current waveforms in FIGS. 2a–2c. Application of a negative polarity input pulse with an above-threshold amplitude causes the collector current to increase from zero to a first magnitude indicating the "on" state of the device which persists until application of the succeeding above-threshold amplitude, positive polarity input pulse switches the collector current back to the zero level indicating the "off" state.

Also, the voltage at the collector terminal ($V_{BC}$) decreases from a first to a second magnitude which persists until application of the turn-off pulse switches the voltage back to the first magnitude. The avalanche triode is, therefore, a memory device in that the "on" states remain indefinitely until the appropriate drive signal forces a change of state, or until the collector bias is removed. Input signals with a subthreshold absolute amplitude (see FIG. 2d) are ineffective to switch the controlled avalanche triode between conducting and nonconducting states. In general, the input signals, whether applied to the emitter terminal alone, the base terminal alone, or coincidentally to both the emitter and the base terminals, must have an above-threshold absolute amplitude and a polarity to successively forward-bias and reverse-bias the emitter-base junction. The "on" and "off" states can be determined by sensing a selected circuit parameter, either current or voltage, at any of the three triode terminals. A brief and readily understood explanation for this behavior is that the input signal injects electrons $e$ which traverse the base region into controlled avalanche zone 17 where additional electron-hole pairs are created. Hot-holes $h$ generated by the avalanche process return to the base region, and a fraction of these holes enter the emitter because they do not thermalize sufficiently before diffusing across the base. The other returning hot-holes are thermalized and establish a lateral return hole base current which flows toward the base terminal. The voltage drop due to the lateral return hole current flowing in the lateral base resistance has a polarity to forward-bias the emitter-base junction and establish a positive feedback mechanism which maintains conduction of the triode even when the input signal is removed. The hole feedback stops when the applied voltage to the emitter-base junction is momentarily sufficiently reversed. Most of the energy used in the switching process is derived from the collector bias, rather than from the input signal as in the case of the bipolar transistor, thereby resulting in higher speed in the controlled avalanche triode.

Figure 3:
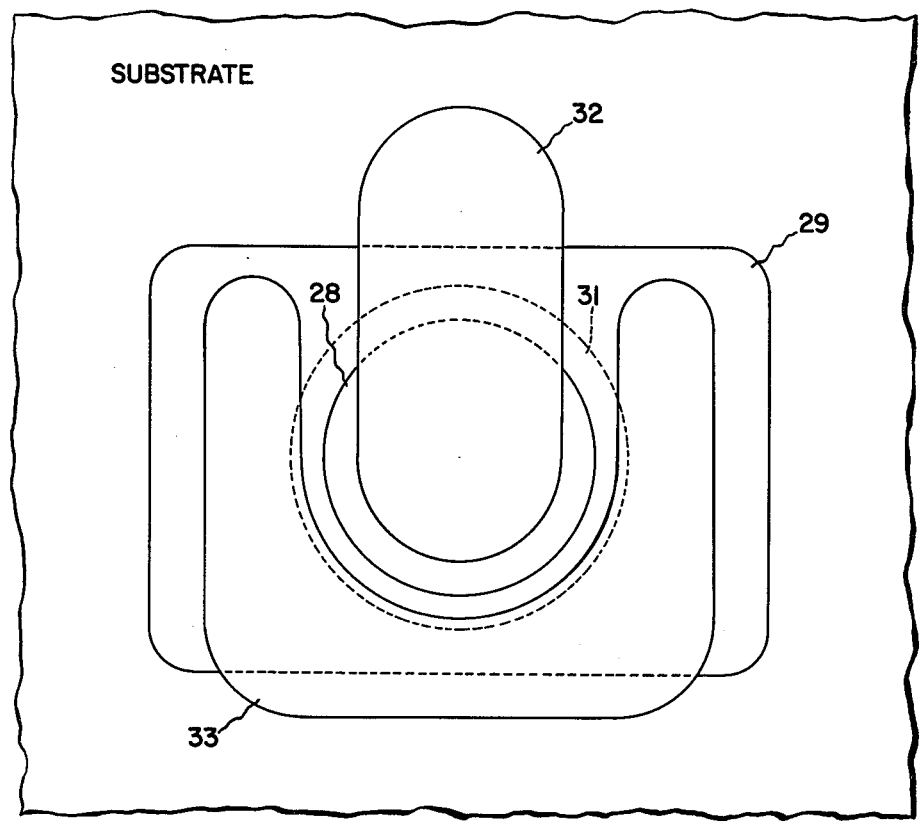
FIGS. 3 and 4 are top and cross sectional views of an avalanche triode illustrating its internal construction.
Figure 4:
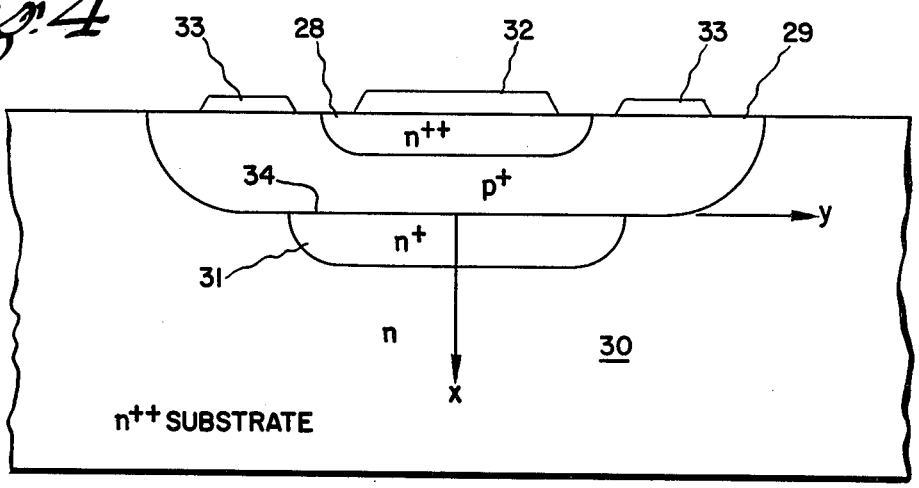

An exemplary embodiment of the internal structure of a controlled avalanche or avalanche memory triode is illustrated in FIGS. 3 and 4. For further information on the controlled avalanche triode in a form more suitable for microwave power amplification, reference may be made to the inventors' previously mentioned U.S. Pat. No. 3,821,657 and to the article "Theory of a New Three-Terminal Microwave Power Amplifier" by the inventors jointly with John R. Eshbach, IEEE Transactions on Electron Devices, Vol. 23, No. 3, March 1976, pages 332–343. For the present application, the collector region need not have a drift zone and the integral of doping times length is more important. Also, it is not essential to have unequal avalanche coefficients, this being a material parameter, and it is often desirable anyway to have npn and pnp devices on the same wafer. Starting at the wafer surface, the device includes a heavily doped n-type emitter region 28 of relatively small diameter, a heavily doped p-type abase region 29 of relatively large diameter, and in the collector region 30 a moderately heavily doped n-type controlled avalanche layer or zone 31 of intermediate diameter followed by a lightly doped zone before entering the heavily doped n-type substrate. On the surface of the wafer are patterned metallizations providing an emitter contact 32 and a base contact 33. In the lateral or $y$ direction, it is essential for proper operation of the controlled avalanche triode that the $n^+$ avalanche zone 31 be of limited lateral extent and located generally centrally of the base-collector junction 34, such that avalanche is confined to this region as opposed to avalanche at the periphery of the base-collector junction. In FIG. 3a, the larger diameter dashed circle represents the periphery of the avalanche zone whereas the smaller dashed circle represents the periphery of the emitter region.

Figure 5:
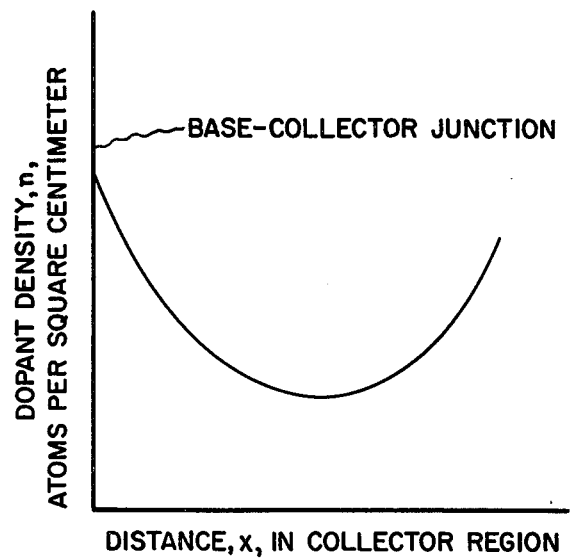
FIG. 5 shows the hyperabrupt doping profile in the collector region of a preferred form of the avalanche triode.

Referring also to FIG. 5, the collector region in and under the avalanche zone has a hyperabrupt doping profile in which the doping is high at the base-collector junction and low near the collector electrode, rising sharply in the electrode itself. For silicon, the condition is that $$\int n dx \lesssim 3 \times 10^{12} \text{cm}^{-2}$$

where $x$ is taken vertically through the wafer, $n$ is the doping in the $n^+$ region, and the integral is over the $n^+$ thickness. At the edge of the base-collector junction, laterally outside of the avalanche zone, the integral of doping times length is less than this value. The base curvature may have to be of larger radius to prevent edge breakdown, or can be guarded. Thus, avalanche multiplication is achieved at a geometrically controlled location. In a typical device the breakdown voltage in the region in and under the avalanche zone is about 10 volts, whereas outside of the avalanche zone the breakdown voltage can be about 100 volts.

A more detailed theoretical explanation of the controlled avalanche triode memory characteristic such that it remains conducting after removal of the injection signal can now be given. For a sufficient bias voltage, the electric field at the base-collector junction is such that an electron injected from the emitter-base junction into the high electric field region gets multiplied via the avalanche process by a factor M. This implies (M−1) pairs of electron-hole pairs generated for each electron injected. The (M−1) holes return to the base. Part of these returning holes go into the emitter, and another part become the freely conducting holes in the p-type base. The former part is responsible for a lower apparent multiplication factor discussed in the published article cited earlier, while the latter part is of interest here. This latter part of the hole current flows out of the base contact, its energy being supplied by the avalanche field. Space charge, as well as the ohmic sheet resistance to the hole current in the base, gives rise to the lateral voltage distribution forward-biasing the emitter-base junction and having a larger magnitude in the center region of the junction than at the edge. Additional external resistance, if any, between the base and emitter will also generate more forward bias due to this hole current.

As a result of the forward bias caused by this hole current, the emitter-base junction injects more electrons into the avalanche zone and even more returning holes result. This is a positive feedback condition, and the current will grow until the I-R drop in the external circuit causes the collector voltage to drop, thus reducing the field and the avalanche multiplication factor until an equilibrium current is reached, i.e., the "on" state.

On the other hand, as in a common transistor, a small fraction of the electrons injected from the emitter is absorbed in the base. The resultant electron current in the base has exactly the opposite effect as the said hole current. The energy supplying the electron current derives from the emitter base signal. The emitter-base forward current-voltage characteristic also represents a positive resistance to the emitter base signal. The total positive resistance to the emitter base signal is therefore made up of these two components.

The positive feedback mechanism causing current growth due to the hole current must counteract the said positive resistance. Because the positive feedback effect is stronger at larger current while the reverse is true for the positive resistance, there exists a threshold current (and the associated signal voltage) beyond which the device will go into the "on" state. The avalanche current and the returning hole feedback are sufficient to sustain the forward-biased condition even when the applied voltage to the emitter-base junction is zero. The triode remains conducting from emitter to collector, and stays in the conducting state until the applied voltage to the emitter base junction is momentarily sufficiently reversed. The injection process then stops as does the hole feedback.

Figure 6:
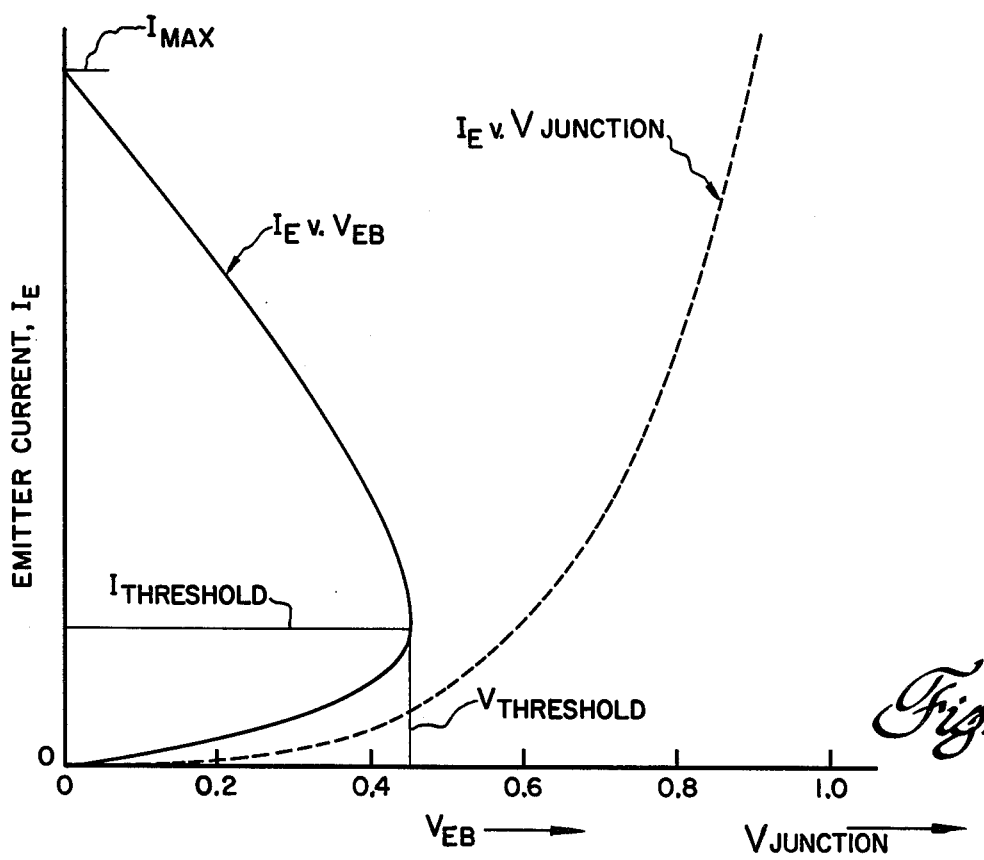
FIG. 6 is a plot of emitter current versus both the emitter-base voltage and the junction voltage to further explain operation of the device.

The more rigorous explanation of the positive feedback effect of returning holes is seen in FIG. 6, in which the emitter current, $I_E$, is plotted against both the normalized applied voltage between emitter and base terminals, $V_{EB}$, and the normalized junction voltage, $V_{junction}$, at the emitter-base junction. The emitter current is a double valued function of $V_{EB}$; whenever the input current or voltage signal applied between emitter and base terminals exceeds the threshold values, $I_{threshold}$ and $V_{threshold}$, the emitter current assumes a value $I_{max}$ upon removal of the input signal rather than returning to zero. On the other hand, the emitter current versus junction voltage curve is a single valued curve as in the bipolar transistor and approaches an asymptotic value. At the emitter current $I_{max}$, there is a junction voltage which maintains the returning hole feedback even when the input signal is removed and $V_{EB}$ is zero. The $I_{max}$ is determined by circuit impedances which cause the collector bias to drop and tend to self-limit the returning hole feedback. In view of the foregoing discussion, it is clear that the conducting and nonconducting states of the controlled avalanche triode can be identified by sensing the voltage or the current at any of the triode terminals.

Other switch and logic applications for the controlled avalanche memory triode are shown in FIGS. 7–14. Because of the similarity in circuit use to a bipolar transistor, great flexibility is allowed in controlling the device and sensing the "on" and "off" condition of the device. That is, the device offers many combinations permitting the choice of logic connections to take advantage of the voltage and impedance levels called for in different applications. FIG. 7a depicts a fast avalanche triode switch circuit which is identical to the memory device in FIG. 1 with the exception that the base resistance is made zero to decrease the switching time. The output voltage $V_o$ is taken off the collector terminal. The grounded emitter switch configuration in FIG. 7b is an alternative form for input signals applied to the base. Since the emitter-base current is carried mainly by hot carriers generated in the avalanche process, the switching circuit requires lower power. Although the external function is similar to that of the silicon controlled rectifier, the internal mechanism of the silicon controlled rectifier makes it a slow switch and difficult to turn off. The avalanche memory triode switch is fast and easy to turn off.

FIG. 8 illustrates a latched AND logic gate circuit or, alternatively, a random access memory cell constructed with only one avalanche triode. The npn triode 11 is turned on and off by a pair of coincident and opposite polarity subthreshold input pulses applied respectively to the emitter and base terminals. Therefore, each terminal has a separate pulse source 35a or 35b. An individual input pulse is ineffective to switch avalanche triode 11, but when applied simultaneously the pair of input pulses has an above-threshold amplitude and switches the triode. Operation of the AND gate with a controlled avalanche triode is obvious. For the random access memory cell application, a rectangular array of triodes is provided each having connection to a corresponding rectangular array of access lines. To switch a particular selected triode in the array, coincident subthreshold signals on both of the appropriate access lines are required. A useful feature in a memory application is to be able to write a "one" only or "zero" only. This is accomplished in FIGS. 9a and 9b, respectively, by applying a positive or negative voltage bias $V_{DC}$ to either the base or emitter terminal. Only one polarity of input signal in combination with the voltage bias rises to an above-threshold amplitude as indicated by the dashed lines, the other polarity input signal in combination with the voltage bias being subthreshold. Using the voltage bias technique just explained, the "off" state may be biased to almost "on" so that a small input signal turns on the triode. A large "off" signal may be required to turn off the triode. On the other hand, the quiescent state bias can be so low as to require a large signal to turn on the device and a small signal to turn it off. Hence the device trigger level may be adjusted to favor either the "on" or "off" signal, a useful feature in logic applications.

Figure 10A:
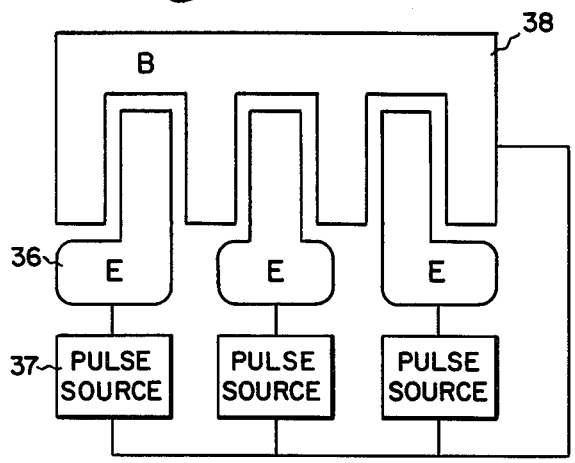
FIGS. 10a and 10b are top views of an OR or AND logic gates with, respectively, multiple emitters and multiple bases.
Figure 10B:
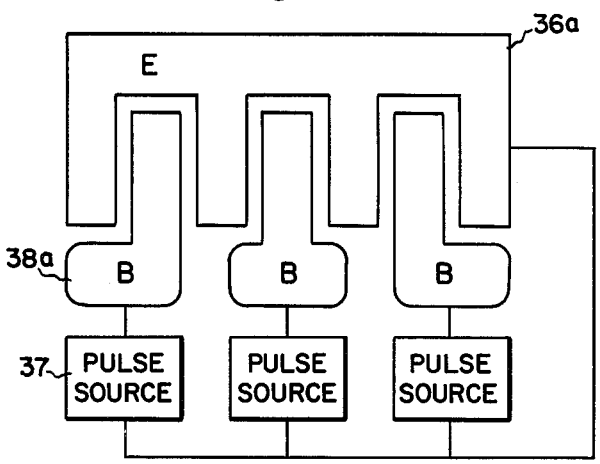

An OR logic gate is implemented, for instance, as depicted in FIG. 10a wherein the controlled avalanche triode has a single base region and a plurality of emitter regions with separate emitter terminals. As shown, three isolated emitter regions 36 are each coupled by a separate pulse source 37 to the single base contact or terminal 38, so that above-threshold input signals from any one of the pulse sources are effective to switch the triode between conducting and nonconducting states. Alternatively, the multiple emitter region avalanche triode can be operated as an AND gate by inserting a resistor between each pulse source and terminal to thereby convert the input voltage signals to an input current signal. The individual input signals are subthreshold and a combination of input signals are required to switch the device. FIG. 10b illustrates an OR or AND gate constructed with a triode having a single emitter 36a and multiple bases 38a with separate base terminals. As before, an above-threshold input signal applied to any one base terminal or a combination of subthreshold signals applied simultaneously to a plurality of base terminals switches the device.

Figure 11:
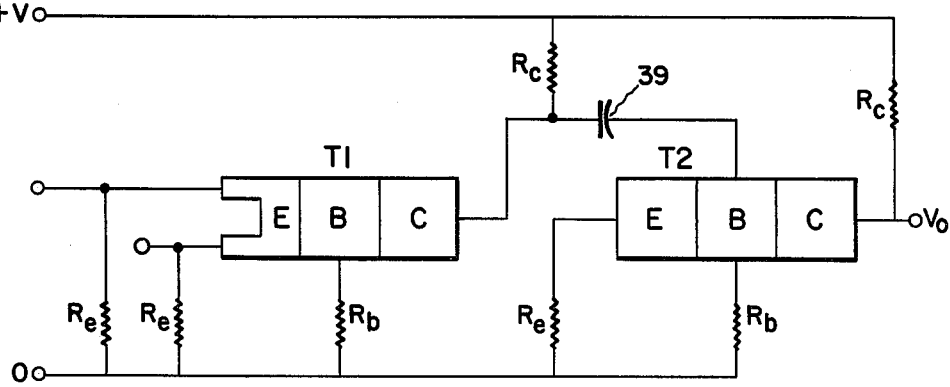
FIG. 11 is a schematic diagram of a NOR logic gate comprised by an OR gate and an INVERT circuit.

A NOR logic gate is implemented by the combination of an OR gate with an INVERT gate. The NOR logic circuit in FIG. 11 uses two controlled avalanche triodes T1 and T2, the first of which has multiple emitter regions as just discussed so that an above-threshold input signal applied to either emitter terminal switches the device. In this figure and also FIGS. 12 and 14, the emitter, base, and collector resistors for convenience are identified as $R_e$, $R_b$, and $R_c$. The collector resistors for both triodes in FIG. 11 are coupled to the collector bias voltage $+V$, and all the emitter and base resistors are coupled to ground. The added component is a coupling capacitor 39 connected between the collector of T1 and the base of T2. In operation, one triode is conducting and the other is not conducting. An input signal applied to either emitter terminal to T1 turns on T1, thereby decreasing its collector voltage, this change in voltage being coupled through capacitor 39 to the base of T2. Triode T2 thus turns off and the output voltage $V_o$ at the collector increases in magnitude, thereby indicating the nonconducting state of the triode. It will be evident that a NAND logic gate can be built using an AND gate in combination with an INVERT gate.

Figure 12:
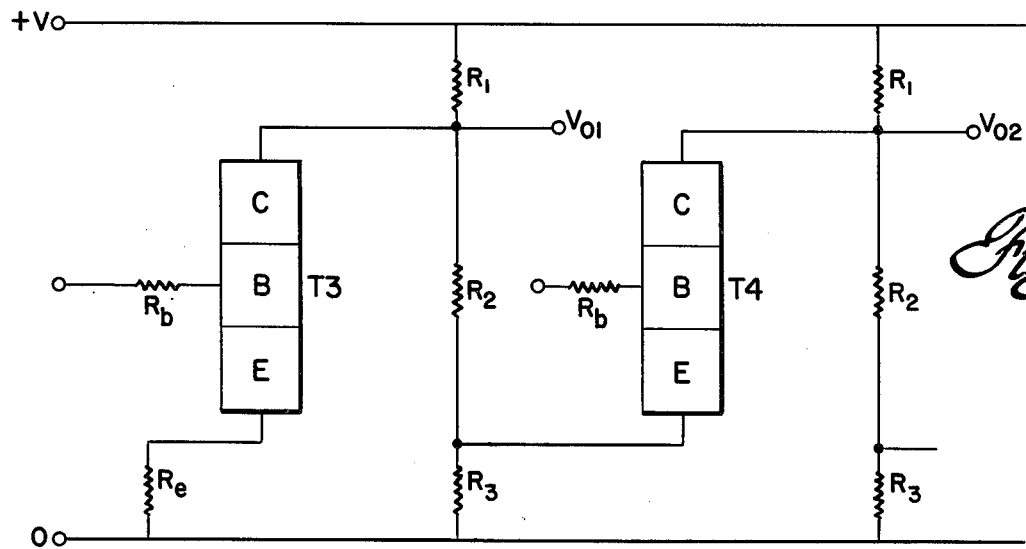
FIG. 12 is a schematic circuit diagram of a type of shift register with an output at successive stages in sequence.

The shift register circuit in FIG. 12 is constructed with only resistors and one device per stage, and has outputs $V_{01}$, $V_{02}$, etc., which switch from high to low magnitude as turn-on pulses are applied. The first stage includes a voltage divider comprising resistors $R_1$, $R_2$, and $R_3$ connected between the collector bias $+V$ and ground, with the collector terminal of avalanche triode T3 connected to the junction of the first two voltage divider resistors at which point the output $V_{01}$ is taken. Input pulses are supplied through base resistor $R_b$, and the first triode has a separate emitter resistor $R_e$. In the voltage divider, the first resistor $R_1$ functions as the collector resistor for triode T3, while resistor $R_3$ functions as the emitter resistor for the next stage triode T4. Assuming that all of the avalanche triodes are nonconducting, the voltage at the collector of triode T3 is high and the voltage across resistor $R_3$ applies a positive voltage bias to the emitter of triode T4. Above-threshold input pulses are applied to the bases of all the triodes, however only the first stage triode T3 turns on since subsequent stage triodes, such as triode T4, are positively biased at the emitter. With triode T3 turned on, the collector voltage drops, thereby decreasing the voltage across resistor $R_3$ and the positive bias at the emitter of triode T4. The next input pulse is of sufficient magnitude to overcome this smaller bias, and triode T4 can be turned on.

Figure 13:
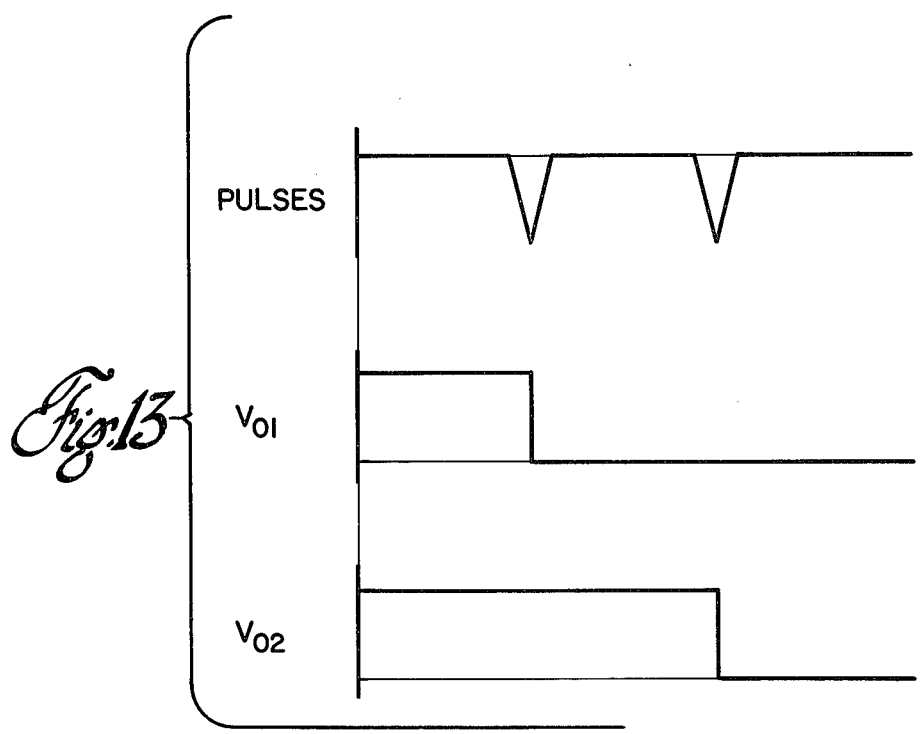
FIG. 13 is a series of waveform diagrams useful in explaining the operation of FIG. 12.

It is seen from the input pulse and output voltage waveforms in FIG. 13 that preceeding stages remain "on" as the next stage in sequence becomes conducting and produces an output. To turn off all the stages at once, a turn-off input pulse is applied to the base of each triode or, alternatively, the collector bias voltage is reduced. One application for this type of shift register is to sample a periodic waveform, and in this case each individual output is used to successively gate a sensor to sample a signal. For devices fabricated in integrated circuit form, a power-delay time product of the order of 1-10 picojoules is projected with a bit rate capability of $10^9$ or more.

Figure 14:
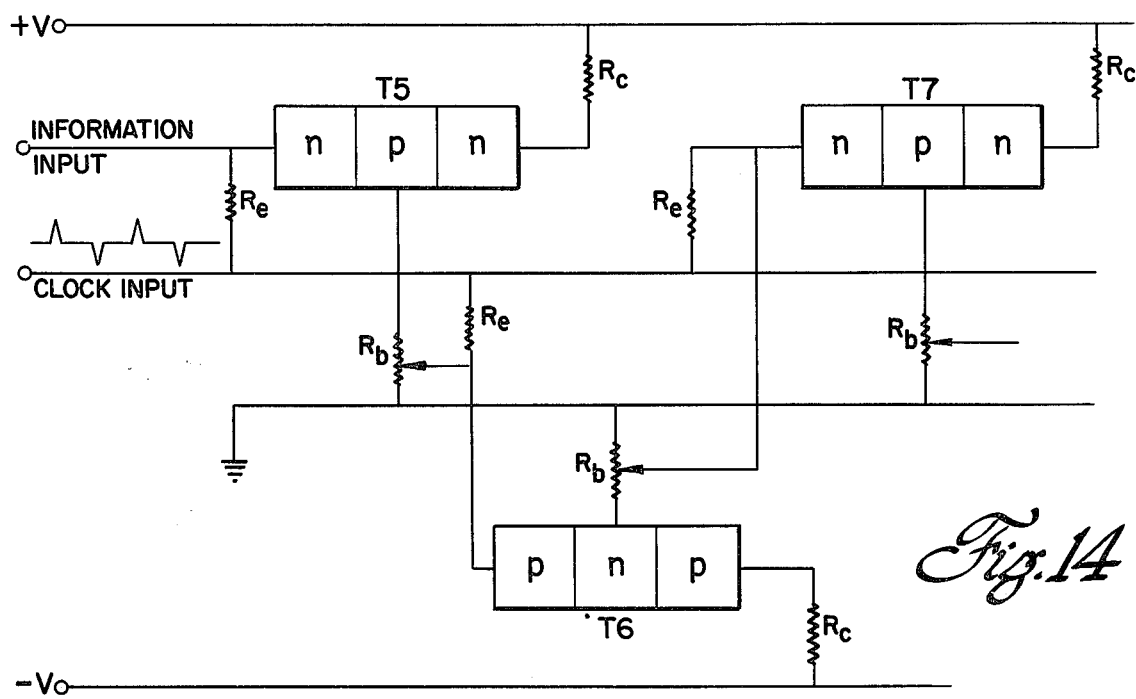
FIG. 14 is a schematic circuit diagram of a conventional shift register with complementary controlled avalanche triode logic.

The conventional avalanche triode shift register in FIG. 14 employs complementary devices and requires two devices per stage. Controlled avalanche triodes T5, T6, and T7 become conductive in sequence as subthreshold clock pulses are applied through the respective emitter resistors. Alternate npn and pnp devices derive their collector voltage from a positive source $+V$ and a negative source $-V$, and the base of each device is coupled through a potentiometer type base resistor to ground. Information input pulses are supplied to the emitter of the first triode T5 coincident with the clock pulses. In operation, triode T5 switches "on" so that the voltage across the base resistor $R_b$ increases and applies a positive bias to the emitter of the pnp triode T6. The succeeding opposite polarity clock pulse is sufficient, in combination with the bias voltage, to turn on triode T6, thereby increasing the voltage across its base resistor and applying a negative bias to the emitter of npn triode T7. The devices turn on in sequence, advancing the information through the shift register. Whenever a preceding device is not conducting, there is no forward bias at the emitter of the next device so that a sub-threshold clock pulse is ineffective to switch the next device to the conducting state. The number of avalanche triodes and the input and output arrangement can be quite arbitrary. For example, the input and output can both be in the pnp part of the circuit, or the input can be in the npn part and the output in the pnp part, and vice versa.

Using the foregoing principles, other logic devices and circuits can be fabricated including a ring oscillator, a clock, a phase shifter, and a delay line. These are in addition to the switch device, memory circuit with one triode per cell, and various logic gates. In summary, these devices and circuits can be made of silicon so that they can be incorporated into present large scale integration technology, are simple to fabricate, simple to operate, are small per unit memory or unit logic step, are fast with a switching time less than 1 nanosecond, consume a small amount of power with a power-delay time product less than $10^{-12}$ joules, and have a simple cascading topology for easy access and transfer of logic data. The silicon controlled avalanche memory triode makes possible the integrated combination of ultrahigh speed logic functions and memories on the same chip. The gain and speed over other silicon logic devices is due to the avalanche current multiplication mechanism.

While the invention has been particularly shown and described with reference to several preferred embodiments thereof, it will be understood by those skilled in the art that various changes in form and details may be made therein without departing from the spirit and scope of the invention.

The invention claimed is:

1. A semiconductor circuit for use selectively in memory and logic applications comprising
   a controlled avalanche memory triode operable at microwave frequencies and comprising contiguous emitter, base, and collector regions each having a terminal and defining emitter-base and base-collector junctions, said emitter and collector regions being of one conductivity type and said base region being of the other conductivity type, said collector region further having an avalanche zone of limited lateral extent,
   bias means for applying a reverse bias voltage to said base-collector junction sufficient to cause low ratio avalanche multiplication of charge carriers injected into said collector region, and
   pulse source means for supplying input signals with a predetermined interval therebetween effectively in circuit between said emitter and base terminals, one input signal having a polarity to forward-bias said emitter-base junction while the succeeding input signal has a polarity to reverse-bias said emitter-base junction, said one input signal functioning to switch a selected circuit parameter at one of said terminals from a first to a second magnitude which persists until the application of the succeeding input signal switches the selected circuit parameter back to said first magnitude.

2. The semiconductor circuit according to claim 1 further including a collector resistor in circuit with said collector terminal and bias means and an emitter resistor and a base resistor respectively coupled to said emitter and base terminals.

3. The semiconductor circuit according to claim 2 wherein each of said input signals is a single pulse with an absolute amplitude exceeding a threshold value sufficient to switch the circuit parameter at one of said terminals between the first and second magnitudes.

4. The semiconductor circuit according to claim 2 wherein each of said input signals is comprised of a pair of coincident and opposite polarity pulses applied respectively to said emitter and base terminals, said pulses individually being of subthreshold amplitude but in combination having an amplitude exceeding a threshold value and sufficient to switch the circuit parameter at one of said terminals between the first and second magnitudes.

5. The semiconductor circuit according to claim 2 further including means for selectively applying a voltage bias to at least one of said emitter and base terminals to which said input signals are supplied, each of said input signals being a single pulse which in combination with said voltage bias has an absolute amplitude exceeding a threshold value and sufficient to switch the circuit parameter at one of said terminals between the first and second magnitudes.

6. The semiconductor circuit according to claim 2 wherein said avalanche memory triode has at least one additional emitter region with an associated additional emitter terminal, and an additional pulse source means for supplying input signals with a predetermined interval therebetween in circuit between said additional emitter terminal and said base terminal.

7. The semiconductor circuit according to claim 2 wherein said avalanche memory triode has at least one additional base region with an associated additional base terminal, and an additional pulse source means for supplying input signals with a predetermined interval therebetween in circuit between said emitter terminal and said additional base terminal.

8. The semiconductor circuit according to claim 1 further including a collector resistor in circuit with said collector terminal and bias means, and another resistor coupled to one of said emitter and base terminals, said semiconductor circuit being a switch device.

9. The semiconductor circuit according to claim 8 wherein each of said input signals is a single pulse with an absolute amplitude exceeding a threshold value and sufficient to switch the circuit parameter at one of said terminals between the first and second magnitudes.

10. A semiconductor circuit according to claim 1 wherein said circuit is a fast switch device.

11. The semiconductor circuit according to claim 1 wherein said circuit is a high speed memory device.

12. A semiconductor circuit according to claim 1 wherein said circuit is a logic gate.

13. A semiconductor circuit according to claim 1 wherein said circuit is a shift register stage component.

14. A semiconductor circuit for use selectively in memory and logic applications comprising
   a controlled avalanche memory triode device operable at microwave frequencies and comprising contiguous emitter, base, and collector regions each having a terminal and defining emitter-base and base-collector junctions, said emitter and collector regions being of one conductivity type and said base region being of the other conductivity type, said collector region further having a hyperabrupt region located generally centrally of said base-collector junction, bias means for applying a reverse bias voltage between said collector and base terminals sufficient to cause low ratio avalanche multiplication of charge carriers injected into said collector region, a collector resistor in circuit with said collector terminal and bias means, and an emitter resistor coupled to said emitter terminal and a base resistor coupled to said base terminal.

pulse source means for supplying narrow input signals with a predetermined interval therebetween to at least one of said emitter and base terminals, one input signal having a polarity to forward-bias said emitter-base junction while the succeeding input signal has a polarity to reverse-bias said emitter-base junction, said one input signal functioning to switch the voltage at said collector terminal from a first to a second magnitude which persists until application of the succeeding input signal switches the voltage at said collector terminal back to said first magnitude.

15. The semiconductor circuit according to claim 14 wherein each of said input signals is a single pulse with an absolute amplitude exceeding a threshold value and sufficient to switch the voltage at said collector terminal between the first and second magnitudes.

16. The semiconductor circuit according to claim 14 wherein each of said input signals is comprised of a pair of coincident and opposite polarity pulses applied respectively to said emitter and base terminals, said pulses individually being of subthreshold amplitude but in combination having an amplitude exceeding a threshold value and sufficient to switch the voltage at said collector terminal between the first and second magnitudes.

17. The semiconductor circuit according to claim 14 wherein said pulse source means supplies said input signals to said emitter terminal, and said avalanche memory triode device has at least one additional emitter region with an associated additional emitter terminal, and an additional pulse source means for supplying narrow input signals with a predetermined interval therebetween to said additional emitter terminal.

18. The semiconductor circuit according to claim 14 wherein said pulse source means supplies said input signals to said base terminal, and said avalanche memory triode device has at least one additional base region with an associated additional base terminal, and an additional pulse source means for supplying narrow input signals with a predetermined interval therebetween to said additional base terminal.

19. A semiconductor circuit for use as a switch comprising
a controlled avalanche memory triode device operable at microwave frequencies and comprising contiguous emitter, base, and collector regions each having a terminal and defining emitter-base and base-collector junctions, said emitter and collector regions being of one conductivity type and said base region being of the other conductivity type, said collector region further having a hyperabrupt region located generally centrally of said base-collector junction, bias means for applying a reverse bias voltage between said collector and base terminals sufficient to cause low ratio avalanche multiplication of charge carriers injected into said collector region, a collection resistor in circuit with said collector terminal and bias means, and another resistor coupled to one of said emitter and base terminals, and pulse source means for supplying narrow input signals with a predetermined interval therebetween to at least one of said emitter and base terminals, one input signal having a polarity to forward bias said emitter-base junction while the succeeding input signal has a polarity to reverse-bias said emitter-base junction, said one input signal functioning to switch the voltage at said collector terminal from a first to a second magnitude which persists until application of the succeeding input signal switches the voltage at said collector terminal back to said first magnitude.

20. The semiconductor circuit according to claim 19 wherein said pulse source means supplies said input signals to said emitter terminal, each of said input signals being a single pulse with an absolute amplitude exceeding a threshold value sufficient to switch the voltage at said collector terminal between the first and second magnitudes.

* * * * *